United States Patent
Ogawara et al.

(10) Patent No.: US 8,147,717 B2
(45) Date of Patent: Apr. 3, 2012

(54) GREEN EMITTING PHOSPHOR

(75) Inventors: Riichi Ogawara, Ageo (JP); Asuka Sasakura, Ageo (JP); Jun-ichi Itoh, Ageo (JP); Taizou Morinaka, Hida (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 13/056,834

(22) PCT Filed: Jan. 7, 2009

(86) PCT No.: PCT/JP2009/000024
§ 371 (c)(1),
(2), (4) Date: Jan. 31, 2011

(87) PCT Pub. No.: WO2010/029654
PCT Pub. Date: Mar. 18, 2010

(65) Prior Publication Data
US 2011/0114985 A1 May 19, 2011

(30) Foreign Application Priority Data
Sep. 11, 2008 (JP) .................. 2008-233810

(51) Int. Cl.
C09K 11/62 (2006.01)
(52) U.S. Cl. .................. 252/301.4 S; 313/486; 313/487
(58) Field of Classification Search ............ 252/301.4 S; 313/486, 487
See application file for complete search history.

(56) References Cited

U.S. PATENT DOCUMENTS

| | | | | |
|---|---|---|---|---|
| 4,859,902 A * | 8/1989 | De Leeuw et al. ............ | 313/474 |
| 5,581,150 A * | 12/1996 | Rack et al. ................... | 313/509 |
| 5,656,888 A * | 8/1997 | Sun et al. ...................... | 313/503 |
| 7,022,261 B2 * | 4/2006 | Hampden-Smith et al. ........................ | 252/301.4 S |
| 7,125,501 B2 * | 10/2006 | Tian et al. ............... | 252/301.4 S |
| 2004/0206973 A1 * | 10/2004 | Tian et al. ........................ | 257/98 |
| 2008/0259251 A1 * | 10/2008 | Heo et al. ......................... | 349/69 |
| 2009/0039759 A1 | 2/2009 | Yokosawa et al. | |
| 2011/0164435 A1 * | 7/2011 | Hussell et al. ................ | 362/612 |

FOREIGN PATENT DOCUMENTS

| | | |
|---|---|---|
| JP | 2002060747 A | 2/2002 |
| JP | 2007056267 A | 3/2007 |
| JP | 2007214579 A | 8/2007 |
| JP | 2007238827 A | 9/2007 |
| JP | 2007525552 A | 9/2007 |

OTHER PUBLICATIONS

Nazarov, Mihail et al., "Structural and luminescent properties of calcium, strontium and barium thiogallates", Materials Chemistry and Physics, 2008, vol. 107, pp. 456-464.

Xu, Jian, "Luminescent Properties of Ga2S3:Eu2+ and SrGa(2+x)S(4+y):Eu2+ Phosphors", Journal of the Chinese Rare Earth Society, Dec. 2003, vol. 21, No. 6, pp. 635-638.

Xu, Zheng et al., "Preparation and Luminescence of a Kind of TFEL Materials", Chinese Journal of Materials Research, Oct. 1997, vol. 11, No. 5, pp. 519-522.

* cited by examiner

Primary Examiner — Carol M Koslow
(74) Attorney, Agent, or Firm — The Webb Law Firm

(57) ABSTRACT

A green emitting phosphor is provided, allowing the internal quantum efficiency to be increased. The green emitting phosphor comprises a mother crystal containing Sr, Ga and S, and a luminescent center, characterized in that, in an XRD pattern, the ratio of the diffraction intensity of the maximum peak appearing at diffraction angle $2\theta=14$ to $20°$ over the diffraction intensity of the maximum peak appearing at diffraction angle $2\theta=21$ to $27°$ is 0.4 or greater.

6 Claims, 6 Drawing Sheets

GREEN EMITTING PHOSPHOR

TECHNICAL FIELD

The present invention relates to a green emitting phosphor. Specifically, it relates to a green emitting phosphor that can be excited with a blue LED or a near-ultraviolet LED, and can be used as a phosphor for lighting or be used as a backlight for liquid crystal display or a display phosphor such as for FED (Field Emission Display), PDP (plasma display) and EL (electroluminescence).

TECHNICAL BACKGROUND

Although the mainstream light sources for lighting currently are fluorescent lights and incandescent light bulbs, those using LEDs (light-emitting diodes) as the light source, compared to fluorescent lights or the like, have less consumption power, longer life span, excellent safety aspects such as not being hot to the touch, and moreover, excellent environmental aspects as they do not contain toxic substances such as mercury, such that they are anticipated to become the mainstream light sources for lighting in the near future.

White LEDs currently in use are constituted by combining a blue LED and a YAG:Ce (yellow); they bear the problem of having poor color rendering properties to show natural coloration, and in particular, when a red object or a human skin is illuminated with such currently used white LEDs, they cannot show the colors illuminated by natural light. Thus, as methods for improving the color rendering properties of such currently used white LEDs, constituting a white LED by combining a near-ultraviolet LED and three types of phosphor, red, green and blue, or combining a blue LED and two types of phosphor, red and green, has been examined, and $SrGa_2S_4$:Eu has been described as a green emitting phosphor used for such purposes (refer to Patent References 1, 2 and 3).

[Patent Reference 1] Japanese Patent Application Laid-open No. 2002-060747
[Patent Reference 2] Japanese Patent Application Laid-open No. 2007-056267
[Patent Reference 3] Japanese Patent Application Laid-open No. 2007-214579

DISCLOSURE OF THE INVENTION

Issues to be Addressed by the Invention

In prior art, green emitting phosphors comprising the disclosed $SrGa_2S_4$:Eu needed to increase light-emitting efficiency further. To increase light-emitting efficiency, it is important to use phosphors with high external quantum efficiency (=internal quantum efficiency×absorptance). However, for instance, in order to obtain white light by combining a near-ultraviolet LED or a blue LED and a phosphor containing a green emitting phosphor as described earlier, the light emitted by the LED and the light emitted by the phosphor by absorbing this LED light are combined to obtain the white light, such that the light emitted by the LED needs to be transmitted suitably. Thus, in such an application, it is necessary to increase the external quantum efficiency by increasing the internal quantum efficiency of the phosphor, or to increase the light emission intensity of the phosphor.

Thus, the present invention provides a green emitting phosphor having even higher internal quantum efficiency.

Means to Address the Issues

The present invention proposes a green emitting phosphor, comprising a mother crystal containing Sr, Ga and S, and a luminescent center, wherein in an XRD pattern using a CuKα beam, the ratio of the diffraction intensity of the maximum peak appearing at diffraction angle 2θ=14 to 20° over the diffraction intensity of the maximum peak appearing at diffraction angle 2θ=21 to 27° is 0.4 or greater.

The green emitting phosphor of the present invention has the characteristics that in an XRD pattern the ratio of the diffraction intensity of the maximum peak appearing at diffraction angle 2θ=14 to 20° over the diffraction intensity of the maximum peak appearing at diffraction angle 2θ=21 to 27° is significantly high, and that the internal quantum efficiency is high, and for instance, when a near-ultraviolet LED or a blue LED serving as an excitation source and a phosphor containing the green emitting phosphor of the present invention are combined to create a white light-emitting device or unit, a more sufficient white light can be obtained, as the internal quantum efficiency is high and thus the light-emitting efficiency is high. In addition, a sufficient amount of light-emission can be obtained even when a limited amount of green emitting phosphor is combined with an LED with limited characteristics.

BEST MODE TO CARRY OUT THE INVENTION

Hereinafter, embodiments of the present invention will be described in detail; however, the scope of the present invention is not to be limited to the embodiments described below.

The green emitting phosphor according to the present embodiment (hereinafter referred to as "the present green emitting phosphor") is a green emitting phosphor comprising a mother crystal containing Sr, Ga and S, which has been doped with $Eu^{2+}$ as a luminescent center, and preferably is a phosphor containing a crystal represented by the general formula $SrGa_2S_4$:$Eu^{2+}$.

In so doing, it is desirable that the luminescent center (light-emitting ion) of the present green emitting phosphor is one containing divalent $Eu^{2+}$, and, in particular, a divalent $Eu^{2+}$ alone. It is known that the light-emission wavelengths (colors) of $Eu^{2+}$ depend on the mother crystal, demonstrating various wavelengths depending on the mother crystal, a mother crystal specified by the present green emitting phosphor allows an emission spectrum demonstrating green color to be obtained.

The concentration in $Eu^{2+}$ is preferably 0.1 to 10 mol % of the concentration in Sr in the mother crystal, of which 0.5 to 7 mol % and particularly 1 to 5 mol % from among this are desirable.

Note that similar effects can be anticipated using as the luminescent center (light-emitting ion) ions other than $Eu^{2+}$, for instance, one species or two or more species of ions chosen from the group comprising rare earth ions and transition metal ions. As the rare earth ions, for instance, ions such as Sc, Tb, Er and Ce may be cited, and as the transition metal ions, for instance, ions such as Mn, Cu, Ag, Cr and Ti may be cited.

Figure 4:
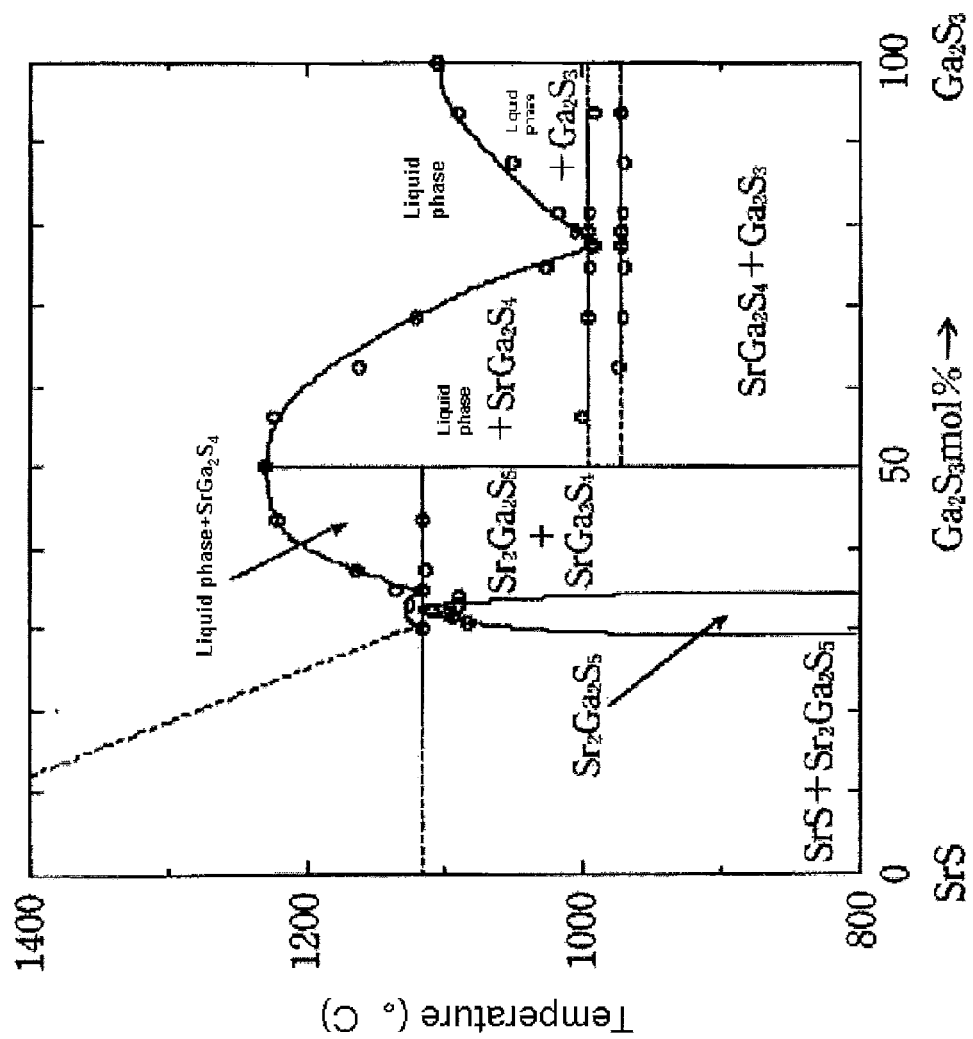
FIG. 4 $SrS$—$Ga_2S_3$ system phase diagram.

The present green emitting phosphor may be a single phase of $SrGa_2S_4$:$Eu^{2+}$ or may contain an impurity phase. That is to say, since those that have been cooled after reaching the "liquid phase+$SrGa_2S_4$" indicated in the SrS—$Ga_2S_3$ system phase diagram (refer to FIG. 4), and among these, those that have been cooled after reaching the "liquid phase+$SrGa_2S_4$", which is a region with 50 mol % or more $Ga_2S_3$, are desirable, the phosphor may contain the impurity phase resulting from cooling the liquid phase component.

In addition, although the phosphor is one containing Ga at a proportion of 2.00 mol with respect to 1.0 mol of Sr according to the stoichiometric composition indicated by $SrGa_2S_4$, since, as described above, the present green emitting phosphor may be a single phase of $SrGa_2S_4$:$Eu^{2+}$ or may contain an impurity phase, in particular among which one that has been cooled after reaching "liquid phase+$SrGa_2S_4$", which is a region 50 mol % or more $Ga_2S_3$, is desirable, the present green emitting phosphor is one that includes cases where Ga is contained in excess only by a given amount from the stoichiometric composition indicated by $SrGa_2S_4$. In so doing, it is desirable that Ga is contained in excess so as to have 2.02 to 3.02 for the molar ratio (Ga/Sr) of the Ga content over the Sr content. In particular, it is desirable that the lower limit value thereof is 2.02 or greater, of which in particular 2.21 or greater is desirable, and for the upper limit value, 2.72 or lower, of which in particular 2.45 or lower is desirable.

However, this does not mean that there is a limitation to those containing Ga in excess from the stoichiometric composition indicated by $SrGa_2S_4$. The reason is, as described below, there are methods that allow the present green emitting phosphor to be obtained, other than by including excess Ga.

(Characteristics from X-Ray Diffraction)

It is important for the present green emitting phosphor that, as measured with an x-ray diffractometer (XRD), in an XRD pattern using CuKα beam, the ratio (400)/(422) of the diffraction intensity of the maximum peak appearing at diffraction angle 2θ=14 to 20° over the diffraction intensity of the maximum peak appearing at diffraction angle 2θ=21 to 27° is 0.4 or greater.

Note that the maximum peak appearing at 2θ=21 to 27° is inferred to be a diffraction peak from the (422) plane when taking ICDD 00-025-0895 into consideration and the maximum peak appearing at 2θ=14 to 20° is inferred to be a diffraction peak from the (400) plane when taking ICDD 00-025-0895 into consideration, such that herein, this ratio is also noted (400)/(422).

It has been demonstrated that if (400)/(422) is 0.4 or greater, the internal quantum efficiency becomes higher.

From such a point of view, it is desirable that (400)/(422) of the present green emitting phosphor is 0.4 or greater but 3 or lower; furthermore, a lower limit value of 0.45 or greater is desirable, and in particular, 0.6 or greater is desirable. Meanwhile, an upper limit value of 2.8 or lower is desirable, an in particular 2.5 or lower is desirable.

In addition, it is desirable that the ratio (642)/(444) of the diffraction intensity of the maximum peak appearing at diffraction angle 2θ=32 to 37° over the diffraction intensity of the maximum peak appearing at diffraction angle 2θ=36 to 42° is 0.7 or greater.

Note that the maximum peak appearing at 2θ=36 to 42° is inferred to be a diffraction peak from the (444) plane when taking ICDD 00-025-0895 into consideration and the maximum peak appearing at 2θ=32 to 37° is inferred to be a diffraction peak from the (642) plane when taking ICDD 00-025-0895 into consideration, such that herein, this ratio is also noted (642)/(444).

It has been demonstrated that if (642)/(444) is 0.7 or greater, the internal quantum efficiency becomes higher.

From such a point of view, it is desirable that (642)/(444) of the present green emitting phosphor is 0.7 or greater but 15.0 or lower; furthermore, a lower limit value of 1.0 or greater, of which 1.5 or greater is particularly desirable, and an upper limit value of 12.0 or lower, of which 10.0 or lower is particularly desirable.

In addition, it is desirable that the ratio (422)/(062) of the diffraction intensity of the maximum peak appearing at diffraction angle 2θ=21 to 27° over the diffraction intensity of the maximum peak appearing at diffraction angle 2θ=27 to 34° is 2.6 or greater.

Note that the maximum peak appearing at 2θ=27 to 34° is inferred to be a diffraction peak from the (062) plane when taking ICDD 00-025-0895 into consideration and the maximum peak appearing at 2θ=21 to 27° is inferred to be a diffraction peak from the (422) plane when taking ICDD 00-025-0895 into consideration, such that herein, this ratio is also noted (422)/(062).

It has been demonstrated that if (422)/(062) is 2.6 or greater, the internal quantum efficiency becomes higher.

From such a point of view, it is desirable that (422)/(062) of the present green emitting phosphor is 2.6 or greater but 8.0 or lower; furthermore, a lower limit value of 2.8 or greater, of which 3.0 or greater is particularly desirable, and an upper limit value of 7.0 or lower, of which 6.5 or lower is particularly desirable.

(Characteristics of the Present Green Emitting Phosphor)

The present green emitting phosphor is excited by light with a wavelength of the near-ultraviolet region to the blue region and emits green light.

Regarding the emission spectrum of the present green emitting phosphor, it has a light-emission peak in the region of 502 nm±30 nm to 557 nm±30 nm wavelength, due to light excitation on the order of 300 nm to 510 nm wavelength.

Note that the present green emitting phosphor has one characteristic on the point that the width and position of the emission spectrum are not different when excited at any wavelength from the near-ultraviolet region to the blue region wavelength (on the order of 300 nm to 510 nm) if the composition is the same.

Regarding CIE color coordinates, by substituting the Sr portion with Ca and Ba, the present green emitting phosphor can emit green light represented by x=0.05 to 0.40 and y=0.50 to 0.80, in particular green light represented by x=0.15 to 0.35 and y=0.60 to 0.75, and among this, green light represented by x=0.25 to 0.33 and y=0.65 to 0.73.

(Production Method)

Hereafter, one example of preferred production method for the present green emitting phosphor will be described. However, there is no limitation to the production method described below.

The present green emitting phosphor can be obtained by respectively weighing and mixing raw materials such as Sr raw materials, Ga raw materials, S raw materials and Eu raw materials, firing in a reducing atmosphere at 900 to 1400° C., crushing with a stamp mill, a automatic mortar grinder or the like, then, sorting with a sieve or the like, as necessary annealing, preferably further precipitating with a non-aqueous organic solvent, ethanol etc, or water, removing the supernatant and drying.

In such a production method, in order to obtain the characteristics by x-ray diffraction as described above, methods whereby for instance Ga is mixed in excess from a stoichiometric composition, the firing temperature is adjusted, or a flux is mixed and fired or annealed may be considered.

As Sr raw materials, strontium salts such as multiple oxides and carbonates can be cited in addition to oxides of Sr.

As Ga raw materials, gallium salts such as $Ga_2O_3$ can be cited.

As S raw materials, S, BaS, $SiS_2$, $Ce_2S_3$, $H_2S$ gas and the like can be cited in addition to SrS.

As Eu raw materials, europium compounds (Eu salts) such as $EuF_3$, $Eu_2O_3$ and $EuCl_3$ can be cited.

In so doing, from the stoichiometric composition represented by $SrGa_2S_4$, production is in general by mixing with a proportion of 2.00 moles of Ga to 1.0 mole of Sr; however, in the case of the present green emitting phosphor, Ga may be mixed and included in excess only by a given amount from the stoichiometric composition represented by $SrGa_2S_4$. Concretely, mixing may be in excess of Ga to an extent that the molar ratio (Ga/Sr) of the Ga content with respect to the Sr content becomes 2.02 to 3.02, in particular 2.02 to 2.72, and of this, particularly an extent of 2.21 to 2.45.

Thus, the characteristics according to x-ray diffraction as described above can be obtained also by increasing the molar ratio (Ga/Sr) of the Ga content with respect to the Sr content to greater than 2.00.

In addition, the characteristics according to x-ray diffraction as described above can be obtained also by adding a flux of $MgCl_2$, $CaCl_2$, $NaCl_2$, NaCl, KCl, KI, $SrF_2$, $EuF_3$ and the like.

Note that, in order to improve color rendering properties, rare earth elements such as Pr and Sm may be added to the raw materials as color adjusters.

In order to increase the excitation efficiency, one or more species of elements selected from the elements of the rare earth family, such as Sc, La, Gd and Lu, may be added the raw materials as sensitizers.

However, it is desirable that the amounts thereof added are respectively 5 mol % or less with respect to Sr. If the contents in these elements exceed 5 mol %, there is a concern that large amounts of phases will deposit, notably decreasing the brightness.

In addition, alkaline metal elements, monovalent cationic metals such as $Ag^+$ and halogen ions such as $Cl^-$, $F^-$ and $I^-$ may be added to the raw materials as charge compensators. From the points of charge compensation effect and brightness, it is desirable that the amounts thereof added are to the same extents as the aluminum family and rare earth family contents.

Mixing of the raw materials may be carried out either dry or wet.

When dry mixing, it suffices for instance to mix with a paint shaker, a ball mill or the like, using zirconia balls as a medium, as necessary drying, to obtain a raw materials mixture, which is not to limit the mixing method in particular.

When wet mixing, it suffices to bring the raw materials in a suspension state, and, using zirconia balls as a medium similarly to above, mix with a paint shaker, a ball mill or the like, then, separate the medium with a sieve or the like, and eliminate moisture from the suspension by a suitable drying method such as reduced pressure drying, vacuum drying or spray drying to obtain a dry raw materials mixture.

Prior to firing, the raw materials mixture obtained as described above may be ground, sorted and dried, as necessary. However, there is no absolute need to perform grinding, sorting and drying.

For firing, firing at 1000° C. to 1400° C. is desirable.

In so doing, as firing atmosphere, a nitrogen gas atmosphere containing a small amount of hydrogen gas, a carbon dioxide atmosphere containing carbon monoxide, an atmosphere of hydrogen sulfide, carbon disulfide, other inert gases or reductive gases, and the like, can be adopted, among which firing with hydrogen sulfide atmosphere is desirable.

The characteristics according to x-ray diffraction can also be obtained with the firing temperature. For instance, when more Ga than the stoichiometric composition represented by $SrGa_2S_4$ is mixed, it is desirable to fire at 1100° C. or higher, and in particular at 1150° C. or higher. In addition, when less Ga than the stoichiometric composition represented by $SrGa_2S_4$ is mixed, it is desirable to fire at 1000° C. or higher, and in particular 1050° C. or higher.

Although the upper limit of the firing temperature is determined by the endurable temperature of the firing oven, the decomposition temperature of the product, and the like, firing at 1000 to 1200° C. is particularly desirable in the production method of the present green emitting phosphor. In addition, the firing time is related to the firing temperature, suitable adjustments within a range of 2 hours to 24 hours is desirable.

In the above-mentioned firing, when the raw materials mixture does not contain sulfur raw materials, firing in an atmosphere of hydrogen sulfide or carbon disulfide is desirable. However, when sulfur raw materials are contained in the raw materials mixture, firing is possible in an atmosphere of hydrogen sulfide, carbon disulfide or inert gas. In this case, hydrogen sulfide and carbon disulfide are sometimes turned into sulfur compounds and also have the function of suppressing decomposition of the products.

Meanwhile, when using hydrogen sulfide or carbon disulfide for the firing atmosphere, since these compounds are also turned into sulfur compounds, when, for instance, BaS is used as a raw material constituent, it is equivalent to using a barium compound and a sulfur compound.

In the production of the present green emitting phosphor, it is desirable after firing to crush with a stamp mill, an automatic mortar grinder, a paint shaker and the like, and then sort with a sieve or the like. When crushing, it is desirable to adjust the crushing time so that the particle size does not become excessively fine.

In addition, in the sorting with a sieve or the like, it is desirable to sort so as to remove particle sizes larger than 150 μm, particularly particle sizes larger than 130 μm, and particularly among them, particle sizes larger than 110 μm. In addition, it is desirable to sort so as to remove particle sizes smaller than 2 μm, particularly particle sizes smaller than 3 μm, and particularly among them, particle sizes smaller than 4 μm.

The characteristics according to x-ray diffraction as described above can also be obtained by annealing after crushing as described above.

It is possible to adopt, as the atmosphere for annealing, a nitrogen gas atmosphere containing a small amount of hydrogen gas, a carbon dioxide atmosphere containing carbon monoxide, an atmosphere of hydrogen sulfide, carbon disulfide, other inert gases or reductive gases, and the like, among these, annealing in a hydrogen sulfide atmosphere is desirable.

As the annealing temperature, for instance when less Ga than the stoichiometric composition indicated by $SrGa_2S_4$ is mixed, annealing at 1100° C. or higher, and in particular 1150° C. or higher, is desirable. In addition, when more Ga than the stoichiometric composition indicated by $SrGa_2S_4$ is mixed, annealing at 1000° C. or higher, and in particular 1050° C. or higher is desirable.

The upper limit of the annealing temperature is determined by the endurable temperature of the oven, the decomposition temperature of the product, and the like, annealing at 1000 to 1200° C. is particularly desirable in the production method of the present green emitting phosphor. In addition, the annealing time is related to the annealing temperature, suitable adjustments within a range of 1 hour to 10 hours is desirable.

Furthermore, introducing the obtained materials into a non-aqueous organic solvent, ethanol to begin with, water or the like, stirring while applying ultrasonic vibrations, then, letting the solution to stand still, eliminating the supernatant and recovering the precipitate, followed by drying, is desirable. This last solvent precipitation and sorting treatment allows the internal quantum efficiency and external quantum efficiency to be increased noticeably.

(Applications)

By combination with an excitation source, the present green emitting phosphor can constitute a green light-emitting device or unit, and can be used in various applications. It can be used, for instance, in addition to general lighting, in special light sources, backlights for LCD, display devices such as display devices for EL, FED and CRT.

As one example of green light-emitting device or unit combining the present green emitting phosphor and an excitation source that may excite this, one can be constituted for instance by placing the present green emitting phosphor in the vicinity of a luminous body generating light at 300 nm to 510 nm wavelength (that is, violet light to blue light), that is to say, a position where the light emitted by the luminous body may be received. Concretely, it suffices to layer a phosphor layer comprising the present green emitting phosphor over a luminous body layer comprising a luminous body.

In so doing, for the phosphor layer, it suffices to add the present green emitting phosphor in powder form along with a bonding agent to a suitable solvent, mix thoroughly to disperse the powder homogeneously, coat the obtained coating solution on the surface of the luminescent layer and dry to form a coat film (phosphor layer).

It is also possible to form the phosphor layer by kneading the present green emitting phosphor in a glass composition or a resin composition to disperse the present green emitting phosphor within a glass layer or within a resin layer.

The present green emitting phosphor may be formed into a sheet, and this sheet may be layered over a luminous body layer, and in addition, the present green emitting phosphor may be sputtered directly over a luminous body layer to form a film.

The present green emitting phosphor, a red phosphor, as necessary a blue phosphor, and an excitation source that may excite, these can be combined to constitute a white light-emitting device or unit, which can be used, for instance, in addition to general lighting, in special light sources, backlights for LCD, display devices such as display devices for EL, FED and CRT.

As one example of white light-emitting device or unit constituted by combining the present green emitting phosphor, a red phosphor, as necessary a blue phosphor, and an excitation source that may excite these, one can be constituted for instance by placing the present green emitting phosphor, along with placing a red phosphor and as necessary a blue phosphor, in the vicinity of a luminous body generating light at 300 nm to 510 nm wavelength (that is, violet light to blue light), that is to say, a position where the light emitted by the luminous body may be received.

Concretely, it suffices to layer a phosphor layer comprising the present green emitting phosphor, a phosphor layer comprising a red phosphor, and as necessary a phosphor layer comprising a blue phosphor, over a luminous body layer comprising a luminous body.

It suffices to add, for instance, the present green emitting phosphor, a red phosphor and, as necessary, a blue phosphor, in powder form along with a bonding agent to a suitable solvent, mix thoroughly to disperse [the powders] homogeneously, coat the obtained coating solution on the surface of the luminescent layer and dry to form a coat film (phosphor layer).

It is also possible to form the phosphor layer by kneading the present green emitting phosphor, a red phosphor and, as necessary, a blue phosphor in a glass composition or a resin composition to disperse the phosphor within a glass layer or within a resin layer.

It suffices to form a phosphor layer comprising the present green emitting phosphor and a red phosphor kneaded in a resin, over an excitation source comprising a blue LED or a near-ultraviolet LED.

The present green emitting phosphor, a red phosphor and, as necessary, a blue phosphor may each be formed into a sheet, and this sheet be layered over a luminous body layer, and in addition, the present green emitting phosphor and a red phosphor may be sputtered directly over a luminous body layer to form a film.

(Explanation of Terms)

In the present invention, in "green light-emitting device or unit" or "white light-emitting device or unit", "light-emitting element" means a light-emitting device provided with at least a phosphor and a light-emitting source as an excitation source therefor, which emits a relatively small-scale light, and a "light-emitting unit" means a light-emitting device provided with at least a phosphor and a light-emitting source as an excitation source therefor, which emits a relatively large-scale light.

In the present invention, when "X to Y" (X and Y are any numbers) is stated, it includes the meaning of "X or greater but Y or less" along with the meaning of "preferably greater than X" or "preferably less than Y", unless otherwise specified.

In addition, when "X or greater" (X is any number) or "Y or less" (Y is any number) is stated, it includes the meaning to the effect of "greater than X is desirable" or "less than Y is desirable".

EXAMPLE

Hereinafter, the present invention will be described based on examples. However, the present invention is not limited by these to be interpreted.

<XRD Measurement>

A phosphor powder obtained in Examples 1-12 and Comparative Examples 1-6 served as a sample for x-ray diffraction, this sample was mounted on a holder, and the angles and the intensities of the diffracted beams were measured using MXP18 (manufactured by BRUKER AXS K.K.), under the following conditions:
(Tube) CuKα beam
(Tube voltage) 40 kV
(Tube current) 150 mA
(Sampling interval) 0.02°
(Scanning speed) 4.0°/min
(Start angle) 5.02°
(End angle) 80°

<Measurements of Absorptance, Internal Quantum Efficiency and External Quantum Efficiency>

The absorptance, the internal quantum efficiency and the external quantum efficiency were measured for the phosphor powders obtained in Examples 1-12 and Comparative Examples 1-6, as follows:

The measurement is performed using the spectrofluorimeter FP-6500 and the integrating sphere unit ISF-513 (manufacture by JASCO Corporation), and according to a solid-state quantum efficiency calculation program. Note that the spectrofluorimeter was corrected using a substandard light source and rhodamine B.

The equations for the calculation of the absorptance, the internal quantum efficiency and the external quantum efficiency of the SrGa$_2$S$_4$:Eu phosphor when the excitation light was 466 nm are shown below:

[Math. 1]

Let $P_1(\lambda)$ be the spectrum of a reference whiteboard, $P_2(\lambda)$ the spectrum of a sample and $P_3(\lambda)$ the spectrum of an indirectly excited sample.

Let the surface $L_1$ comprising the spectrum $P_1(\lambda)$ enclosed by the range of excitation wavelength 451 nm-481 nm be the intensity of excitation.

$$L_1 = \int_{451}^{481} P_1(\lambda) d\lambda$$

Let the surface $L_2$ comprising the spectrum $P_2(\lambda)$ enclosed by the range of excitation wavelength 451 nm-481 nm be the diffusion intensity of the sample.

$$L_2 = \int_{451}^{481} P_2(\lambda) d\lambda$$

Let the surface $E_2$ comprising the spectrum $P_2(\lambda)$ enclosed by the range of excitation wavelength 482 nm-648.5 nm be the fluorescence intensity of the sample.

$$E_2 = \int_{482}^{648.5} P_2(\lambda) d\lambda$$

Let the surface $L_3$ comprising the spectrum $P_3(\lambda)$ enclosed by the range of excitation wavelength 451 nm-481 nm be the intensity of indirect diffusion.

$$L_3 = \int_{451}^{481} P_3(\lambda) d\lambda$$

Let the surface $E_3$ comprising the spectrum $P_3(\lambda)$ enclosed by the range of excitation wavelength 482 nm-648.5 nm be the intensity of indirect fluorescence.

$$E_3 = \int_{482}^{648.5} P_3(\lambda) d\lambda$$

The sample absorbance ratio is the ratio of the fraction of excitation light reduced by the sample over the incident light.

$$A = \frac{L_1 - L_2}{L_1}$$

The external quantum efficiency $\epsilon_{ex}$ is the number of photons $N_{em}$ of the fluorescent light emitted from the sample divided by the number of photons $N_{ex}$ of the excitation light irradiated on the sample.

$$N_{ex} = k \cdot L_1$$

$$N_{em} = k \cdot \left(E_2 - \frac{L_2}{L_3} E_3\right)$$

$$\therefore \varepsilon_{ex} = \frac{N_{em}}{N_{ex}} = \frac{E_2 - \frac{L_2}{L_1} E_3}{L_1}$$

The external quantum efficiency $\epsilon_{in}$ is the number of photons $N_{em}$ of the fluorescent light emitted from the sample divided by the number of photons $N_{abs}$ of the excitation light absorbed by the sample.

$$N_{ex} = k \cdot (L_1 - L_2)$$

$$N_{ex} = k \cdot E_2$$

$$\therefore \varepsilon_{ex} = \frac{N_{em}}{N_{abs}} = \frac{E_2 - \frac{L_2}{L_1} E_3}{L_1 - L_2}$$

(From JASCO FWSQ-6-17(32) Solid-state Quantum Efficiency Calculation Program manual)

<Measurements of PL Emission Spectrum and CIE Color Coordinates>

Using a spectrofluorimeter (F-4500, manufactured by Hitachi), PL (photo-luminescence) spectra were measured and PL light-emission intensities were determined for the phosphor powders obtained in Example 1-12 and Comparative Example 1-6.

In addition, the brightness and the light-emission color (xy values of the CIE color coordinates) were determined from the PL emission spectrum.

Example 1

Using SrS, Ga$_2$S$_3$ and EuS as starting raw materials, SrS and Ga$_2$S$_3$ were mixed so that the atomic ratio Ga/Sr was 1.98 and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1130° C. for 4 hours. Next, the fired material was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a phosphor powder sample.

Example 2

Using SrS, Ga$_2$S$_3$ and EuS as starting raw materials, SrS and Ga$_2$S$_3$ were mixed so that the atomic ratio Ga/Sr was 2.00, and while EuS was mixed so as to have 1.0 mol % with respect to Sr, MgCl$_2$ was mixed as flux so as to have 0.5 wt % with respect to SrGa$_2$S$_4$, which were mixed for 100 minutes with a paint shaker using a Ø3 mm zirconia ball as a medium. The obtained mixture was fired in a hydrogen sulfide atmosphere at 1100° C. for 4 hours. Next, the fired material was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a phosphor powder (sample).

Example 3

Using SrS, Ga$_2$S$_3$ and EuS as starting raw materials, SrS and Ga$_2$S$_3$ were mixed so that the atomic ratio Ga/Sr was 2.15, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1100° C. for 6 hours. Next, the fired material was crushed for one minute with an automatic mortar grinder ("ALM-360T" manufactured by Nitto Kagaku Co.), furthermore, annealing in an argon atmosphere at 1100° C. for 4 hours was carried out, and using sieves with 140 mesh and 440 mesh openings, the material under the sieve with 140 mesh opening and above the sieve with 440 mesh opening was recovered to obtain a phosphor powder (sample).

Example 4

Using SrS, Ga$_2$S$_3$ and EuS as starting raw materials, SrS and Ga$_2$S$_3$ were mixed so that the atomic ratio Ga/Sr was 2.00, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1100° C. for 2 hours. Next, the fired material was crushed for one minute with an automatic mortar grinder ("ALM-360T" manufactured by Nitto Kagaku Co.), furthermore, annealing in an argon atmosphere at 1150° C. for 2 hours was carried out, and using sieves with 140 mesh and 440 mesh openings, the material under the sieve with 140 mesh opening and above the sieve with 440 mesh opening was recovered to obtain a phosphor powder (sample).

Example 5

Using SrS, Ga$_2$S$_3$ and EuS as starting raw materials, SrS and Ga$_2$S$_3$ were mixed so that the atomic ratio Ga/Sr was 2.00, and while EuS was mixed so as to have 1.0 mol % with respect to Sr, KI was mixed as flux so as to have 0.5 wt % with respect to SrGa$_2$S$_4$, which were mixed for 100 minutes with a paint shaker using a Ø3 mm zirconia ball as a medium. The obtained mixture was fired in a hydrogen sulfide atmosphere at 1180° C. for 4 hours. Next, the fired material was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a phosphor powder (sample).

Example 6

Using SrS, Ga$_2$S$_3$ and EuS as starting raw materials, SrS and Ga$_2$S$_3$ were mixed so that the atomic ratio Ga/Sr was 2.21, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1100° C. for 4 hours. Next, the fired material was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a phosphor powder (sample).

Example 7

Using SrS, Ga$_2$S$_3$ and EuS as starting raw materials, SrS and Ga$_2$S$_3$ were mixed so that the atomic ratio Ga/Sr was 3.02, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1150° C. for 4 hours. Next, the fired material was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a phosphor powder (sample).

Example 8

Using SrS, Ga$_2$S$_3$ and EuS as starting raw materials, SrS and Ga$_2$S$_3$ were mixed so that the atomic ratio Ga/Sr was 2.00, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1190° C. for 6 hours. Next, the fired material was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a phosphor powder (sample).

Example 9

Using SrS, Ga$_2$S$_3$ and EuS as starting raw materials, SrS and Ga$_2$S$_3$ were mixed so that the atomic ratio Ga/Sr was 2.72, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1050° C. for 4 hours. Next, the fired material was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a phosphor powder (sample).

Example 10

Using SrS, Ga$_2$S$_3$ and EuS as starting raw materials, SrS and Ga$_2$S$_3$ were mixed so that the atomic ratio Ga/Sr was 2.45, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1100° C. for 4 hours. Next, the fired material was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a phosphor powder (sample).

Example 11

Using SrS, $Ga_2S_3$ and EuS as starting raw materials, SrS and $Ga_2S_3$ were mixed so that the atomic ratio Ga/Sr was 2.45, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1100° C. for 4 hours. Next, the fired material was crushed for one minute with an automatic mortar grinder ("ALM-360T" manufactured by Nitto Kagaku Co.), furthermore, annealing in a hydrogen sulfide atmosphere at 1100° C. for 4 hours was carried out, and using sieves with 140 mesh and 440 mesh openings, the material under the sieve with 140 mesh opening and above the sieve with 440 mesh opening was recovered to obtain a phosphor powder (sample).

Example 12

Using SrS, $Ga_2S_3$ and EuS as starting raw materials, SrS and $Ga_2S_3$ were mixed so that the atomic ratio Ga/Sr was 2.45, and EuS was mixed so as to have 1.0 mol % with respect to Sr, which were mixed for 100 minutes with a paint shaker using a Ø3 mm zirconia ball as a medium, and the obtained mixture was fired in a hydrogen sulfide atmosphere at 1200° C. for 4 hours. Next, the fired material was crushed for one minute with an automatic mortar grinder ("ALM-360T" manufactured by Nitto Kagaku Co.), furthermore, annealing in an argon atmosphere at 1150° C. for 6 hours was carried out, and using sieves with 140 mesh and 440 mesh openings, the material under the sieve with 140 mesh opening and above the sieve with 440 mesh opening was recovered to obtain a phosphor powder (sample). In addition, the powder recovered in this way was introduced in a 99.5% ethanol solution (25° C.), dispersed by applying ultrasound ("W-113" manufactured by Honda Electronics) successively at 28 kHz, 45 kHz and 100 kHz while stirring, and after the solution was left to stand for 30 seconds, only the precipitated material was recovered, excluding the supernatant, and dried with a dryer (100° C.) for 10 minutes to obtain a phosphor powder (sample).

Comparative Example 1

Using SrS, $Ga_2S_3$ and EuS as starting raw materials, SrS and $Ga_2S_3$ were mixed so that the atomic ratio Ga/Sr was 1.95, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1100° C. for 2 hours. Next, the fired material was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a phosphor powder (sample).

Comparative Example 2

A phosphor powder (sample) was obtained similarly to Comparative Example 1, except that SrS and $Ga_2S_3$ were mixed so that the atomic ratio Ga/Sr was 2.00.

Comparative Example 3

Using SrS, $Ga_2S_3$ and EuS as starting raw materials, SrS and $Ga_2S_3$ were mixed so that the atomic ratio Ga/Sr was 2.00, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 1100° C. for 4 hours. Next, the fired material was crushed for one minute with an automatic mortar grinder ("ALM-360T" manufactured by Nitto Kagaku Co.), furthermore, annealing in a hydrogen sulfide atmosphere at 1050° C. for 2 hours was carried out, and using sieves with 140 mesh and 440 mesh openings, the material under the sieve with 140 mesh opening and above the sieve with 440 mesh opening was recovered to obtain a phosphor powder (sample).

Comparative Example 4

Using SrS, $Ga_2S_3$ and EuS as starting raw materials, SrS and $Ga_2S_3$ were mixed so that the atomic ratio Ga/Sr was 4.00, and EuS was mixed so as to have 1.0 mol % with respect to Sr, which were mixed for 100 minutes with a paint shaker using a Ø3 mm zirconia ball as a medium. The obtained mixture was fired in a hydrogen sulfide atmosphere at 950° C. for 4 hours. Next, the fired material was crushed for one minute with an automatic mortar grinder ("ALM-360T" manufactured by Nitto Kagaku Co.), and using sieves with 140 mesh and 440 mesh openings, the material under the sieve with 140 mesh opening and above the sieve with 440 mesh opening was recovered to obtain a phosphor powder (sample).

Comparative Example 5

A phosphor powder (sample) was obtained similarly to Comparative Example 4, except that SrS and $Ga_2S_3$ were mixed so that the atomic ratio Ga/Sr was 2.00.

Comparative Example 6

A phosphor powder (sample) was obtained similarly to Comparative Example 4, except that SrS and $Ga_2S_3$ were mixed so that the atomic ratio Ga/Sr was 2.30.

TABLE 1

| | XRD intensity ratio in each plane | | | Internal quantum efficiency | External quantum efficiency |
|---|---|---|---|---|---|
| | (400)/ (422) | (642)/ (444) | (422)/ (062) | ratio % | ratio % |
| Example 1 | 0.45 | 1.00 | 2.80 | 70.1 | 50.0 |
| Example 2 | 0.63 | 1.52 | 3.10 | 73.5 | 51.9 |
| Example 3 | 1.02 | 3.22 | 3.95 | 73.9 | 54.5 |
| Example 4 | 1.12 | 3.26 | 3.96 | 74.0 | 50.9 |
| Example 5 | 1.19 | 3.31 | 4.25 | 74.1 | 48.5 |
| Example 6 | 1.30 | 3.34 | 4.33 | 74.6 | 52.4 |
| Example 7 | 1.41 | 3.36 | 4.37 | 75.3 | 53.1 |
| Example 8 | 1.43 | 3.59 | 4.59 | 75.9 | 53.2 |
| Example 9 | 1.61 | 4.69 | 5.02 | 76.2 | 59.0 |
| Example 10 | 1.89 | 5.10 | 5.06 | 76.8 | 55.0 |

TABLE 1-continued

|  | XRD intensity ratio in each plane | | | Internal quantum efficiency | External quantum efficiency |
| --- | --- | --- | --- | --- | --- |
|  | (400)/ (422) | (642)/ (444) | (422)/ (062) | ratio % | ratio % |
| Example 11 | 2.14 | 5.67 | 5.38 | 77.4 | 56.6 |
| Example 12 | 2.26 | 9.51 | 6.02 | 78.3 | 61.0 |
| Comparative Example 1 | 0.28 | 0.44 | 1.99 | 44.3 | 31.6 |
| Comparative Example 2 | 0.30 | 0.45 | 2.09 | 47.0 | 36.3 |
| Comparative Example 3 | 0.33 | 0.48 | 2.22 | 57.4 | 40.0 |
| Comparative Example 4 | 0.33 | 0.52 | 2.32 | 67.6 | 46.5 |
| Comparative Example 5 | 0.33 | 0.52 | 2.48 | 67.8 | 47.7 |
| Comparative Example 6 | 0.35 | 0.65 | 2.56 | 67.9 | 47.1 |

TABLE 2

| Excerpt from ICDD: 00-025-0895 | | |
| --- | --- | --- |
| Diffraction plane | 2θ (°) | Intensity |
| 400 | 17.0372 | 35 |
| 422 | 24.0980 | 65 |
| 062 | 29.9705 | 25 |
| 642 | 34.4254 | 100 |
| 444 | 38.4209 | 45 |

(Discussion)

When the excitation spectra and emission spectra were measured for the phosphor powders obtained in Examples 1-12 and Comparative Examples 1-6, they were sufficiently excited by a light of 300 nm to 510 nm wavelength (that is, violet light to blue light) and two peaks were observed in the excitation spectra, confirming that they were sufficiently excited by near-ultraviolet light and blue light.

In addition, light-emission peak positions within the range of 502 nm±30 nm to 557 nm±30 nm wavelength were demonstrated, confirming that a green color light in a range of x=0.05 to 0.40, y=0.50 to 0.80 CIE color coordinates was emitted.

Figure 5:
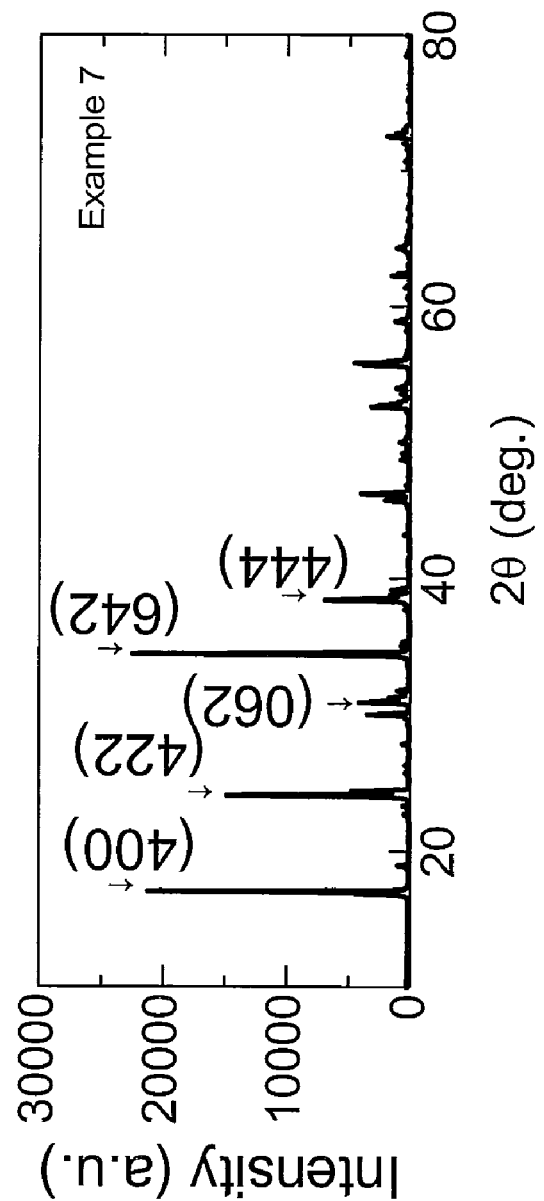
FIG. 5 XRD pattern for Example 7.
Figure 6:
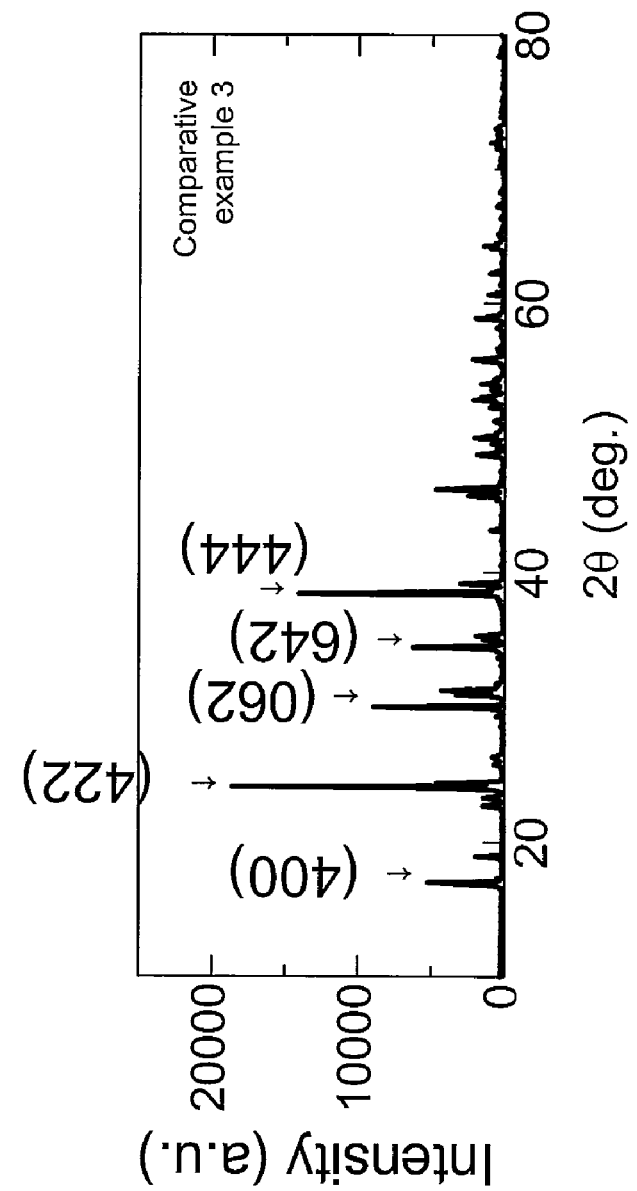
FIG. 6 XRD pattern for Comparative Example 3.

The XRD pattern of Example 7 is shown in FIG. 5 as a representative example of XRD pattern for Examples 1-12 and the XRD pattern of Comparative Example 3 is shown in FIG. 6 for comparison.

Compared to the XRD patterns of Comparative Example 3 and conventional green emitting phosphor ($SrGa_2S_4$), the XRD pattern of the present green emitting phosphor (Example 1-12) was found to have large diffraction intensities for the maximum peaks appearing at diffraction angles 2θ=14 to 20° and 2θ=32 to 37° while the diffraction intensities of the maximum peaks appearing at 2θ=21 to 27°, 27 to 34° and 36 to 42° were small.

Consequently, it can be considered that the characteristics of the present green emitting phosphor can be indicated by the ratio (400)/(422) of the diffraction intensity of the maximum peak appearing at 2θ=14 to 20° over the diffraction intensity of the maximum peak appearing at 2θ=21 to 27°, the ratio (642)/(444) of the diffraction intensity of the maximum peak appearing at 2θ=32 to 37° over the diffraction intensity of the maximum peak appearing at 2θ=36 to 42°, or the ratio (422)/(062) of the diffraction intensity of the maximum peak appearing at 2θ=21 to 27° over the diffraction intensity of the maximum peak appearing at 2θ=27 to 34°.

Figure 1:
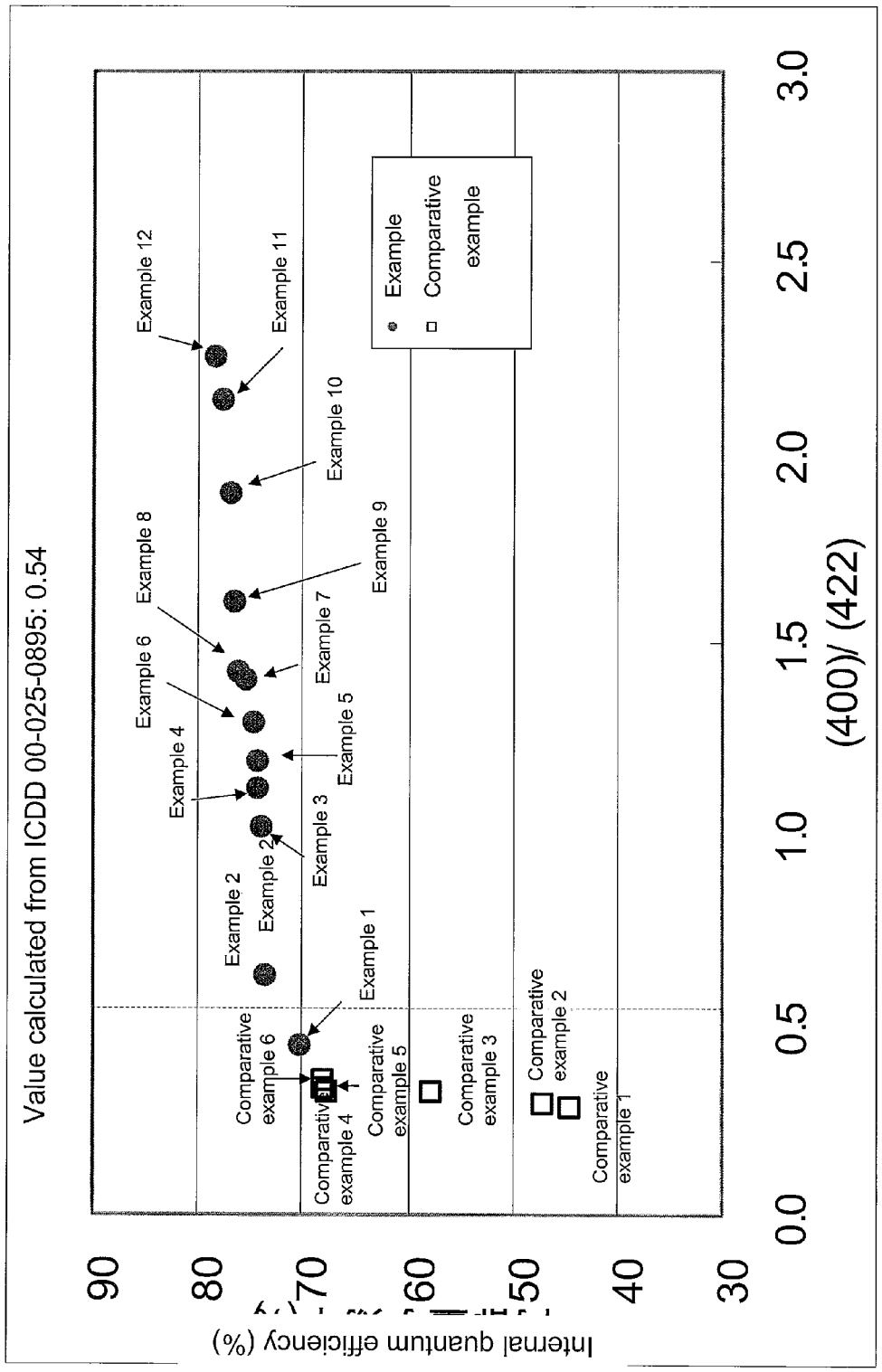
FIG. 1 Figure in which the values for the phosphor powders obtained in Examples 1-12 and Comparative Examples 1-6 were plotted with coordinates comprising the ratio (400)/(422) of the diffraction intensity of the maximum peak appearing at 2θ=14 to 20° over the diffraction intensity of the maximum peak appearing at 2θ=21 to 27° as the horizontal axis and the internal quantum efficiency (%) as the vertical axis. In addition, the dotted line shown in the figure is the value ((400)/(422)=0.54) calculated from the diffraction intensity indicated for the reference sample (00-025-0895) of the International Center for Diffraction Data (ICDD).

From FIG. 1, Examples 1-12 were found to have significantly high (400)/(422), with high internal quantum efficiencies, compared to Comparative Examples 1-6. In particular Examples 2 to 12 had 71% or greater internal quantum efficiency, particularly among them, Examples 7 to 12 were found to have 75% or greater internal quantum efficiency.

In addition, Examples 2-12 were found to have significantly high (400)/(422) also when compared to a reference sample (00-025-0895; $SrGa_2S_4$) from the International Center for Diffraction Data (ICDD).

From such a point of view, it can be considered for the (400)/(422) of the present green emitting phosphor that 0.40 or greater is desirable, in particular, 0.45 or greater, of which in particular 0.6 or greater is more desirable. In addition, it can be considered for the upper limit value that 3 or lower is desirable, since when 3 is exceeded, melting occurs and powders are difficult to obtain.

Figure 2:
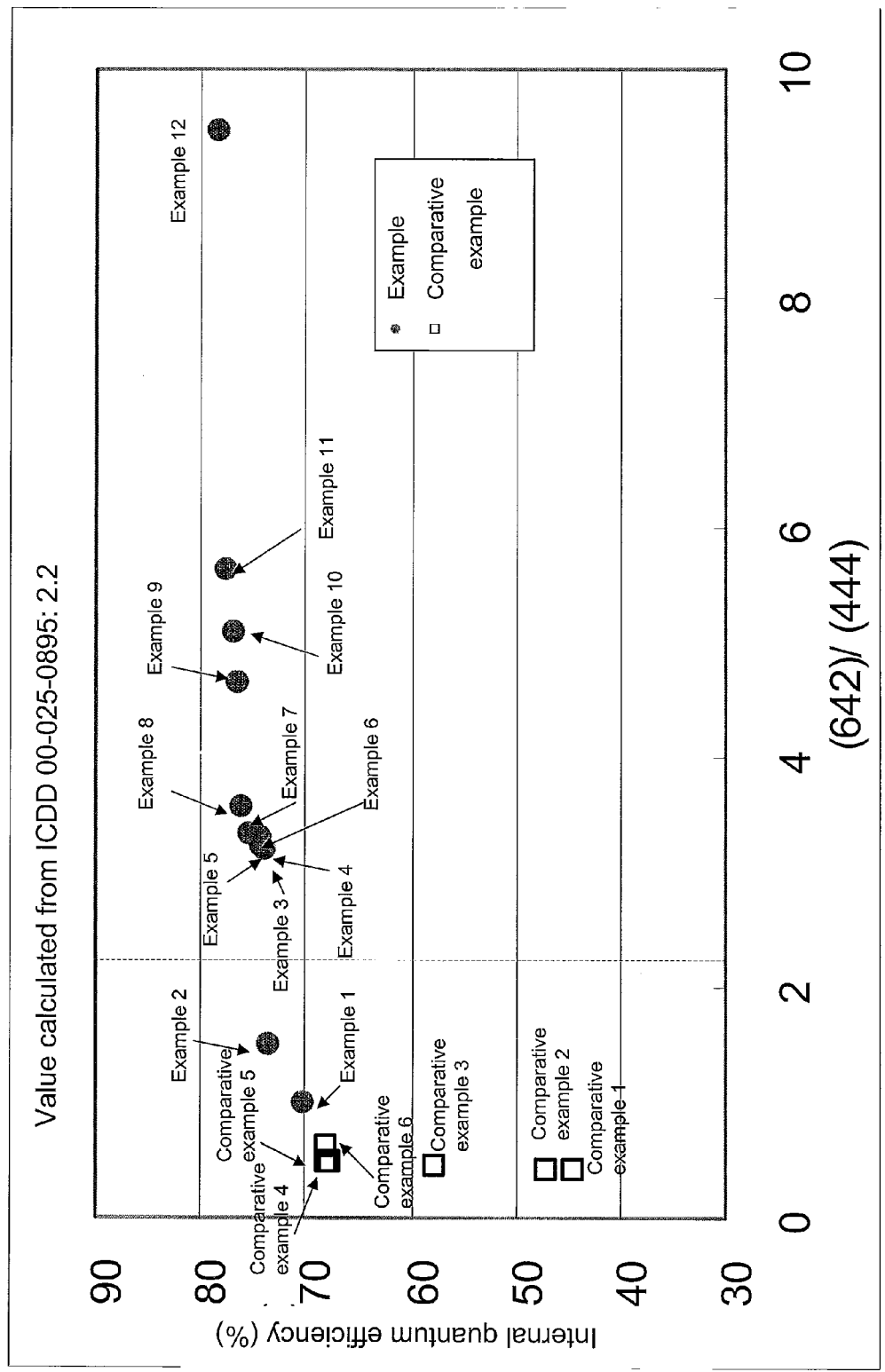
FIG. 2 Figure in which the values for the phosphor powders obtained in Examples 1-12 and Comparative Examples 1-6 were plotted with coordinates comprising the ratio (642)/(444) of the diffraction intensity of the maximum peak appearing at 2θ=32 to 37° over the diffraction intensity of the maximum peak appearing at 2θ=36 to 42° as the horizontal axis and the internal quantum efficiency (%) as the vertical axis. In addition, the dotted line shown in the figure is the value ((642)/(444)=2.2) calculated from the diffraction intensity indicated for the reference sample (00-025-0895) of the International Center for Diffraction Data (ICDD).

From FIG. 2, Examples 1-12 were found to have high internal quantum efficiencies and significantly high (642)/(444) compared to Comparative Examples 1-6.

From such a point of view, it can be considered for the (642)/(444) of the present green emitting phosphor that 0.70 or greater is desirable, in particular, 1.0 or greater, of which in particular 1.5 or greater is more desirable. In addition, it can be considered for the upper limit value that 10.0 or lower is desirable, since when 10.0 is exceeded, melting occurs and powders are difficult to obtain.

Figure 3:
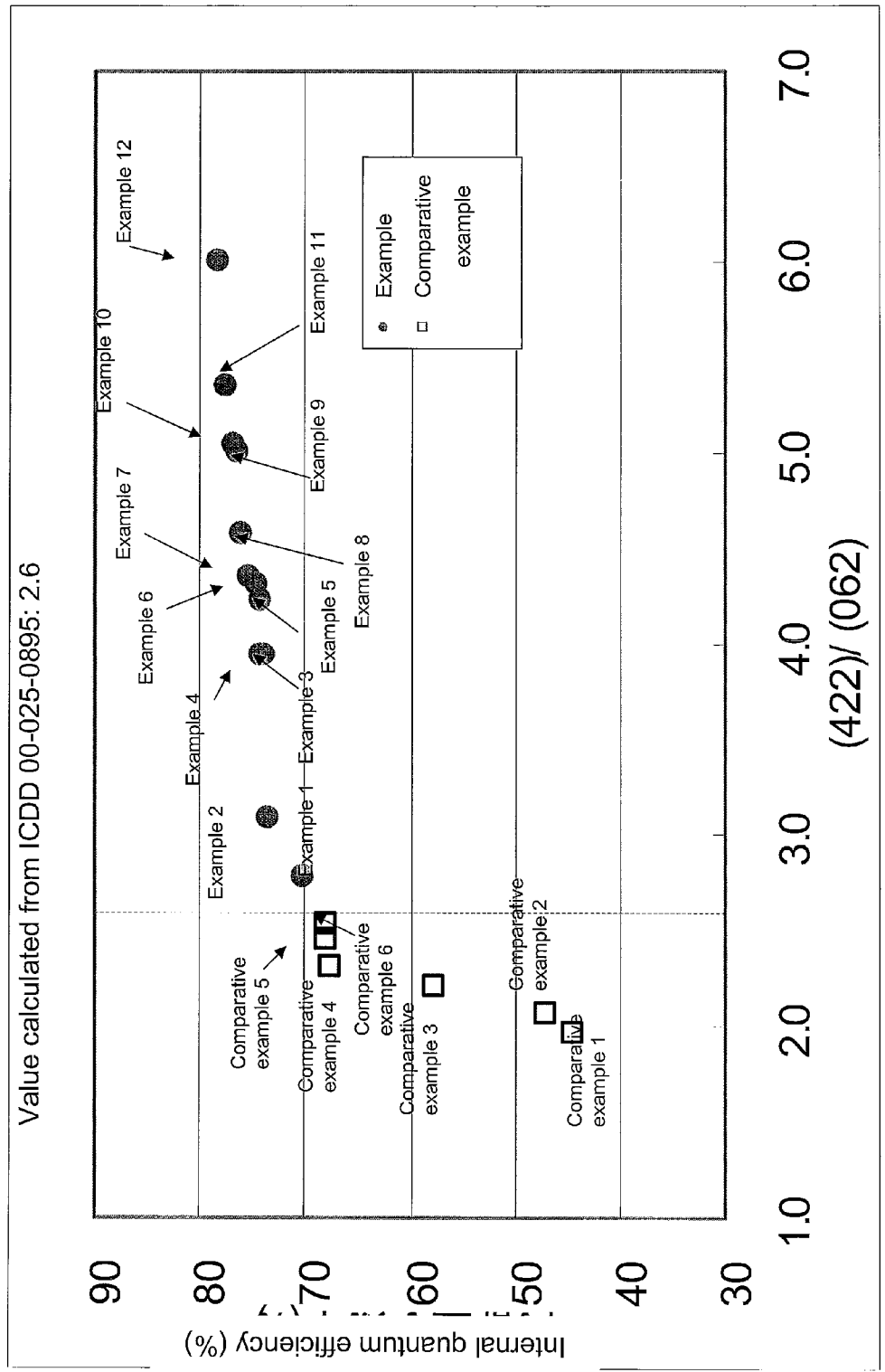
FIG. 3 Figure in which the values for the phosphor powders obtained in Examples 1-12 and Comparative Examples 1-6 were plotted with coordinates comprising the ratio (422)/(062) of the diffraction intensity of the maximum peak appearing at 2θ=21 to 27° over the diffraction intensity of the maximum peak appearing at 2θ=27 to 34° as the horizontal axis and the internal quantum efficiency (%) as the vertical axis. In addition, the dotted line shown in the figure is the value ((422)/(062)=2.6) calculated from the diffraction intensity indicated for the reference sample (00-025-0895) of the International Center for Diffraction Data (ICDD).

From FIG. 3, Examples 1-12 were found to have significantly high (422)/(062) with high internal quantum efficiencies, compared to Comparative Examples 1-6.

In addition, the Examples 1-12 were all found to have high (422)/(062) also when compared to a reference sample (00-025-0895; $SrGa_2S_4$) of the International Center for Diffraction Data (ICDD).

From such a point of view, it can be considered for the (422)/(062) of the present green emitting phosphor that 2.6 or greater is desirable, in particular 2.8 or greater, of which in particular 3.0 or greater is desirable. In addition, for the upper limit value, 8.0 or lower was found to be particularly desirable, since when 8.0 is exceeded, melting occurs and powders are difficult to obtain.

When the test results thus far are examined globally, among the present green emitting phosphors, those cooled after reaching "liquid phase+$SrGa_2S_4$" in the SrS—$Ga_2S_3$ system phase diagram (refer to FIG. 4), and among these, those cooled after reaching "liquid phase+$SrGa_2S_4$" in the region of 50 mol % or greater $Ga_2S_3$, are considered to be desirable from the point of view of increasing the internal quantum efficiency.

The invention claimed is:

1. A green emitting phosphor, comprising an alkaline earth thiogallate mother crystal comprising Sr and a luminescent center comprising $Eu^{2+}$, wherein in an XRD pattern using a CuKα beam, the ratio of the diffraction intensity of the maximum peak appearing at diffraction angle 2θ=14 to 20° over the diffraction intensity of the maximum peak appearing at diffraction angle 2θ=21 to 27° is 0.4 or greater and wherein the ratio of the diffraction intensity of the maximum peak appearing at diffraction angle 2θ=32 to 37° over the diffraction intensity of the maximum peak appearing at diffraction angle 2θ=36 to 42° is 0.7 or greater.

2. The green emitting phosphor according to claim 1, wherein the ratio of the diffraction intensity of the maximum peak appearing at diffraction angle 2θ=21 to 27° over the diffraction intensity of the maximum peak appearing at diffraction angle $2\theta=27$ to $34°$ is 2.6 or greater.

3. A green light-emitting device or unit equipped with an excitation source and the green emitting phosphor according to claim 1.

4. A green light-emitting device or unit equipped with an excitation source and the green emitting phosphor according to claim 2.

5. A white light-emitting device or unit equipped with an excitation source, the green emitting phosphor according to claim 1, and a red emitting phosphor.

6. A white light-emitting device or unit equipped with an excitation source, the green emitting phosphor according to claim 2, and a red emitting phosphor.

* * * * *